United States Patent
Gehrmann et al.

[11] Patent Number: 6,137,148
[45] Date of Patent: Oct. 24, 2000

[54] NMOS TRANSISTOR

[75] Inventors: Andreas Gehrmann, Dortmund; Erhard Muesch, Werne, both of Germany

[73] Assignee: Elmos Semiconductor AG, Dortmund, Germany

[21] Appl. No.: 09/339,224

[22] Filed: Jun. 24, 1999

[30] Foreign Application Priority Data

Jun. 26, 1998 [DE] Germany .............................. 198 28 524
Sep. 3, 1998 [DE] Germany .............................. 198 40 180

[51] Int. Cl.$^7$ ................................................ H01L 29/78
[52] U.S. Cl. .......................... 257/394; 257/396; 257/372; 257/549
[58] Field of Search .................................... 257/372, 368, 257/394–396, 549

[56] References Cited

U.S. PATENT DOCUMENTS

| | | | |
|---|---|---|---|
| 5,376,816 | 12/1994 | Nishigoori et al. | 257/372 |
| 5,497,023 | 3/1996 | Nakazato et al. | 257/394 |
| 5,675,172 | 10/1997 | Miyamoto et al. | 257/396 |
| 5,763,921 | 6/1998 | Okumura et al. | 257/395 |
| 5,899,714 | 5/1999 | Farrenkopf et al. | 257/549 |
| 5,994,755 | 10/1999 | De Jong et al. | 257/549 |

*Primary Examiner*—Gene M. Munson

[57] ABSTRACT

The NMOS transistor is provided with a semiconducting substrate (12) which is p-doped and comprises a top side (14), and with a first region (16) which is n-doped and placed into the substrate by diffusion from the top side (14) of the substrate (12). Further, the transistor comprises a second region (18) arranged within the n-conducting region (16), which is n-doped and introduced into the substrate from the top side (14) of the substrate (12), and a field oxide layer (20) which is arranged on the top side (14) of the substrate (12) and limits the p-conducting region (16) on all sides. The top side comprises a source region (22) and a drain region (24) which are n-doped and arranged within the p-conducting region (18) at a distance to each other. A gate oxide layer (26) is arranged on the top side (14) of the substrate (12) between the source and the drain regions (22, 24). According to the invention it is envisaged that the p-conducting region (18) is placed into the n-conducting region (16) by means of ion implantation and that within the p-conducting region (18) the ion concentration on the top side (14) of the substrate (12) is smaller than that at the lower limit, located within the substrate (12), between the n-conducting region (16) and the p-conducting region (18).

3 Claims, 3 Drawing Sheets

NMOS TRANSISTOR

BACKGROUND OF THE INVENTION

To ensure that an NMOS transistor operates troublefree to the extent possible even at operating voltages below the substrate potential, a well-in-well technology is applied where a second p-conducting region in the form of a p-well is placed into a CMOS process within a first n-conducting region, i. e. an n-well. A section of such a transistor is shown in FIG. 1. The transistor comprises a weakly p-doped semiconducting substrate 1 into which an n-well 2 is placed by means of diffusion. Into this n-conducting region a p-conducting region, i. e. a p-well 4, is placed by diffusion from the top side 3 of the substrate 1. The p-conducting region 4 is limited on all sides by a field oxide layer 5 on the top side 3 of the substrate 1 with the limiting edge of the p-well towards the n-well 2 being located below the field oxide layer 5 due to the "underdiffusion". In the p-well 4 degenerated $n^+$-regions 6 and 7 for source and drain are placed between which the gate oxide layer 8 and the gate electrode 9 are located.

By application of such an NMOS transistor design the following is achieved:
- electrical isolation of the NMOS transistor from the substrate by two pn-transitions,
- prevention of the substrate effect owing to the possibility to apply the potential of the p-well to the source potential of the transistor and
- operation of the p-well and the transistor below substrate potential.

However, the above transistor design requires suitable wells with the n-well having to be considerably deeper than the p-well in order to provide the necessary isolation features and voltage sustaining capabilities. When the usual diffused wells are used, this means a considerable process expenditure:
- An existing n-well CMOS process requires placing of an additional p-well with complete modification of the process start (well diffusion/field oxidation/temperature balance);
- when Epi substrates are used, the penetration depth of the n-well is limited by outdiffusion of the substrate doping;
- in the case of a diffused p-well the surface concentration (threshold voltage of the NMOS transistor) and the doping profile are coupled to each other in the depth (isolation/voltage sustaining capability of the NMOS transistor towards the n-well); matching of the well dopings/diffusions means at the same time influence on almost all other components.

SUMMARY OF THE INVENTION

The object of the present invention is to create a well-in-well NMOS transistor which can be produced applying the process steps of a n-well CMOS process.

To solve this object an NMOS transistor is provided comprising a semiconducting substrate which is p-doped and comprises a top side, a first region which is n-doped and placed into the substrate by diffusion from the top side of the substrate, a second region arranged within the n-conducting region, which is p-doped and placed into the substrate from the top side, a field oxide layer arranged on the top side of the substrate and limits the p-conducting region on all sides, a source region as well as a drain region which are n-doped and arranged at a distance from each other within the p-conducting region on the top side of the substrate, a gate oxide layer arranged on the top side of the substrate between the source and the drain regions, and a gate electrode on the gate oxide layer. This NMOS transistor is characterized in that the p-conducting region is limited on all sides by an active region edge, the p-conducting region is placed by means of an ion implantation into the n-conducting region, and within the p-conducting region the ion concentration on the top side of the substrate is smaller than that at the lower limit, located within the substrate, between the n-conducting region and the p-conducting region. According to the invention the p-conducting region is placed by means of an ion implantation into the n-conducting region, wherein within the p-conducting region the ion concentration on the top side of the substrate is lower than at the lower limit, located within the substrate, between the p-conducting region and the n-conducting region, and wherein the p-conducting region is limited on all sides by an active region edge (self-adjustment).

In the case of the NMOS transistor according to the invention the p-well (p-conducting region or the substrate region proper in which the transistor is configured) is thus produced by ion implantations. This implantation is carried out in two steps with the concentration in the depth of the p-well, i. e. at its lower limit towards the n-well, is larger than at the surface of the p-well where it is determined by the desired threshold voltage.

This retrograde p-doping material concentration profile of the p-well allows the p-well to be con figured relatively flat without there being the danger of a punch-through effect between the degenerated $n^+$-regions for drain or source and the n-well.

To increase the output voltage sustaining capability $U_{DS}$ of the NMOS transistor it is appropriate to space the source and drain regions laterally to the field oxide. To suppress the parasitic NMOS transistor formed by the source or drain region the gate electrode connecting trace and the n-conducting region, it is of advantage when the top side of the substrate comprises an ion concentration increased by means of p-doping ion implantation in the marginal region, adjacent to the field oxide, of the p-conducting region at least below a gate electrode connecting trace.

To realise the NMOS transistor according to the invention a new approach has been selected, i. e.
- maintaining the previous well concept (diffused n-well) and
- producing the p-well by an (existing) implantation,
- with no modification of the thermal balance (compatibility, modular process option) being carried out.

BRIEF DESCRIPTION OF THE DRAWINGS

Hereunder embodiments of the present invention are explained detail with reference to the drawings in which.

DESCRIPTION OF THE PREFERRED EMBODIMENTS

Figure 1:
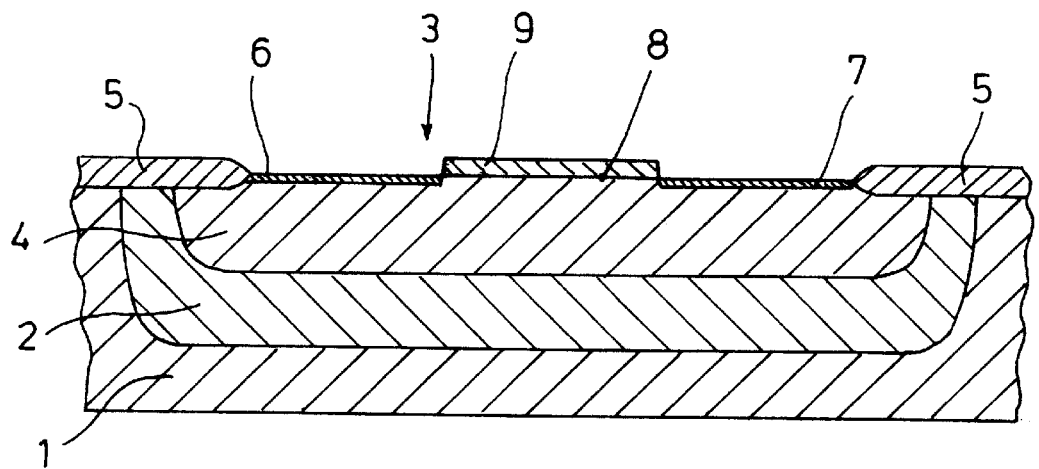
FIG. 1 shows a section of a known well-in-well-type NMOS transistor whose wells are produced by diffusion.
Figure 2:
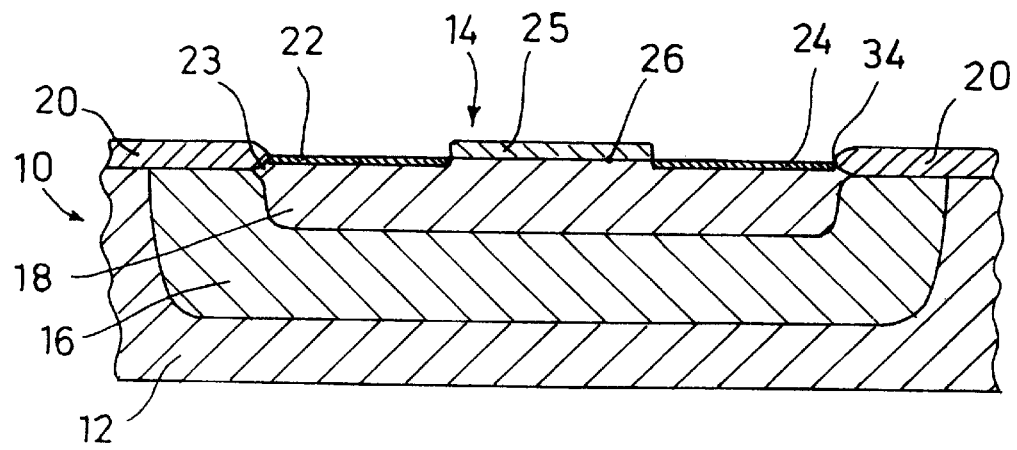
FIG. 2 shows a section of an NMOS transistor according to a first embodiment.

The NMOS transistor 10 according to FIG. 2 comprises a weakly p-doped substrate 12 into which an n-well 16 is diffused from the top side 14. Inside this n-well 16 a p-well 18 produced by double implantation is located which forms the substrate region proper of the NMOS transistor 10. Around the p-well 18 a field oxide layer 20 applied by a LOCOS process is located on the top side 14. Inside the well 18 the n⁺-regions 22, 24 for source and drain as well as the intermediate gate oxide layer 26 and the gate electrode 25 are located on the top side of the substrate 12.

The weakly doped p-well 18 is produced by a boron implantation inside the n-well 16. The following requirements apply to this p-well 18:

low surface concentration to adjust the threshold voltage of the NMOS transistor 10, maximum depth of approximately 1,5 μm (predetermined by n-well 16), adequate doping concentration in the depth to ensure isolation of the transistor 10 towards n-well 16.

In particular in the case of a 1.2 μm or 1.6 μm n-well CMOS-LOCOS process these requirements are met by bipartite implantation (PDEX implantation) carried out after a photolithograhic step prior to the polyseparation. Owing to such implantation almost any retrograde well profile with the desired features with regard to voltage sustaining capability can be adjusted in the depth. The surface doping and thus the threshold voltage of the transistor 10 can be adjusted independent of this by normal threshold voltage implantation.

If the energy of the p-well implantation is selected in such a way that the implantation takes place only in the active region but not in the field oxide layer 20, a self-adjustment of the p-well 18 towards the active region edge 34 is achieved. Together with the low outdiffusion of the implanted p-well 18 this allows a higher packing density in logic applications as compared with diffused p-wells. The lateral isolation 23 is effected here by implantation through the bird's beak at the active region edges, the relatively large lateral scattering of the high-energy p-well implantation as well as the higher outdiffusion of the boron implantation as compared with the arsenic implantation of the implantation of the drain and source regions 22, 24.

Figure 3:
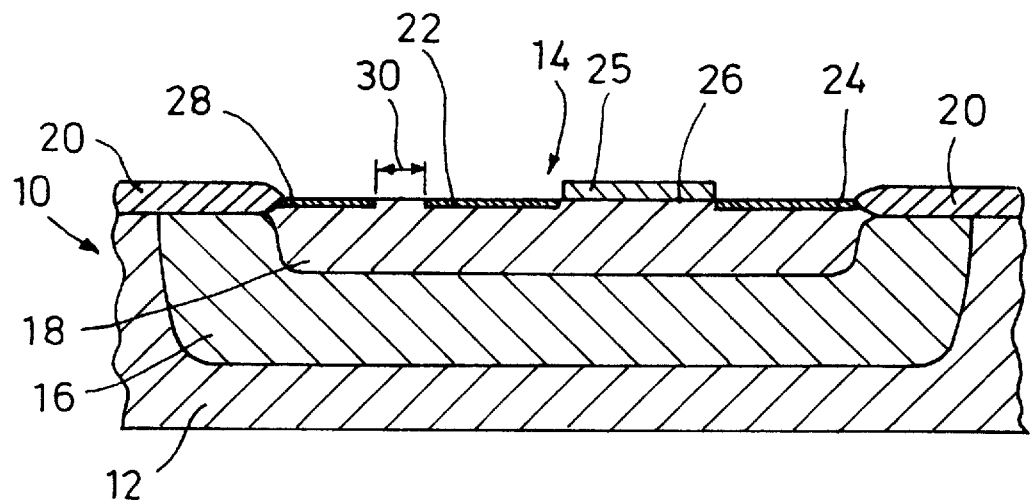
FIG. 3 shows a section of an NMOS transistor according to a second embodiment.

In the present case the junction termination 28 of the p-well 18 must take place within the same active region (see FIG. 3). The drain/source implantation of the PMOS transistors producible applying the CMOS process serves as contact implantation. If the p-well potential is below the source potential of the NMOS transistor 10, it must be made sure that there is an adequate clearance 30 between the p⁺ junction termination 28 and the source or drain region 22, 24.

Figure 4:
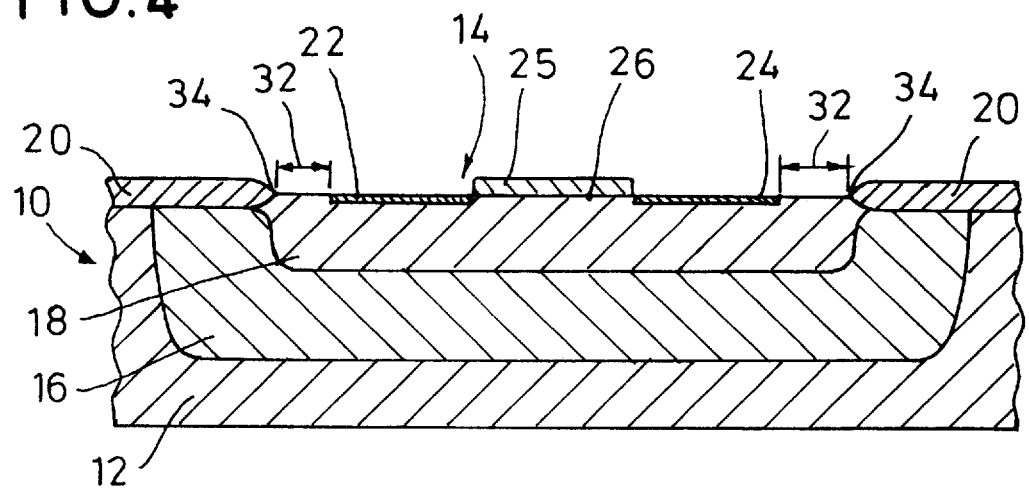
FIG. 4 shows a section of an NMOS transistor according to a third embodiment and FIG. 5 shows a section running transversely to the sectional views of FIGS. 2 and 3 of an NMOS transistor according to a fourth embodiment.
Figure 5:
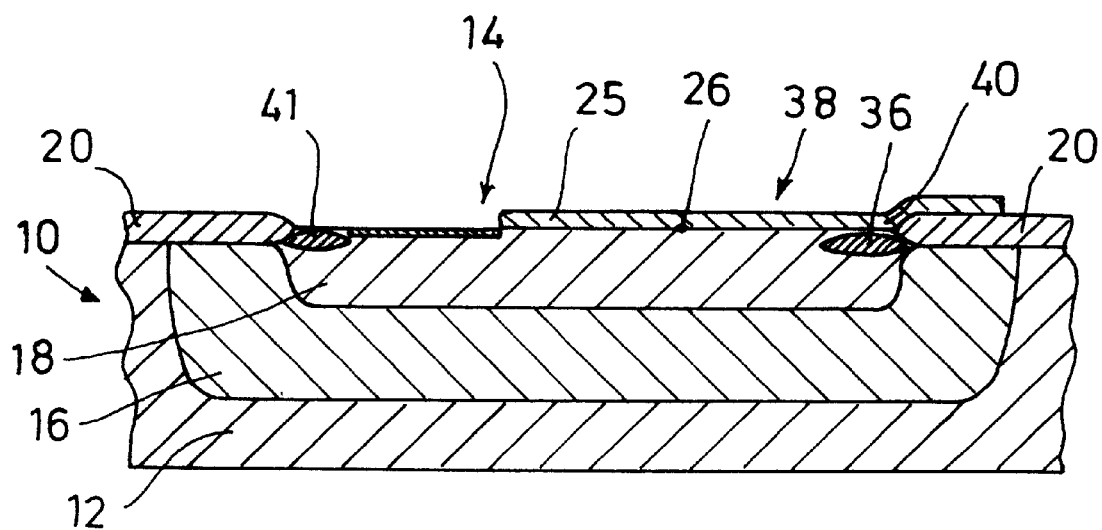

With regard to the required voltage sustaining capability of the NMOS transistor towards the n-well 16 the lateral isolation (clearance 23) represents a critical point in particular in the case of the higher voltages required for analog applications. An increase in the voltage sustaining capability can be achieved by producing a clearance 32 with the aid of a resist mask between the source or drain regions 22, 24 and the active region edge 34 (see FIG. 4). Via another boron implantation included in the process at 41 doping of the p-well 18 can be further increased in the critical region and a punch through effect between the source region 14 and the n-well 16 can be prevented. At the same time an increase in the threshold voltage 36 (see FIG. 5) is achieved for the parasitic NMOS transistor 38 which is formed beneath a polytrace (connecting trace 40 for the gate electrode) between drain or source of the transistor 10 proper and the n-well 16 (see FIG. 5).

The transistor configured in this way meets all requirements stated below and offers complete compatibility with the existing CMOS process:

1. isolation from the p-substrate and thus decoupling from influences exerted by bulk noise and substrate flows,
2. no substrate effect;
3. operation of the NMOS transistor at voltages lower than Vss (substrate potential);
4. suitability for the layout of a CMOS logic completely contained in the n-well,
5. voltage sustaining capability of 5 V for digital applications up to a maximum of 10 V for analog applications,
6. high packing density for logic applications,
7. process enlargement in as little steps as possible and above all in a modular way,
8. no influence exerted by the process enlargemen on the behaviour of the other components.

The only process enlargement is the p-well implantation (PDEX implantation) which is, however, employed in other manufacturing processes in the LOCOS process and does thus not represent an additional new technical process step.

What is claimed is:

1. An NMOS transistor comprising a semiconducting substrate (12) which is p-doped and comprises a top side (14), a first region (16) which is n-doped and placed into the substrate by diffusion from the top side (14) of the substrate (12), a second region (18) arranged within the n-conducting region (16), which is p-doped and placed into the substrate from the top side (14), a field oxide layer (20) arranged on the top side (14) of the substrate (12) and limits the p-conducting region (16) on all sides, a source region (22) as well as a drain region (24) which are n-doped and arranged at a distance from each other within the p-conducting region (18) on the top side (14) of the substrate (12), a gate oxide layer (26) arranged on the top side (14) of the substrate (12) between the source and the drain regions (22, 24), and a gate electrode (25) on the gate oxide layer (26), wherein the p-conducting region (18) is limited on all sides by an active region edge (34), the p-conducting region (18) is placed by means of an ion implantation into the n-conducting region (16), and within the p-conducting region (18) the ion concentration on the top side (14) of the substrate (12) is smaller than that at the lower limit, located within the substrate (12), between the n-conducting region (16) and the p-conducting region (18).

2. The NMOS transistor according to claim 1, wherein the source and the drain region (22, 24) are arranged at a lateral distance (32) to the field oxide (20).

3. The NMOS transistor according to claim 1, wherein the top side (14) of the substrate (12) comprises in the marginal region, adjacent to the field oxide (20), of the p-conducting region (18) at least beneath a gate electrode connecting trace (40) an ion concentration increased by means of p-doping ion implantation to suppress a parasitic NMOS transistor (38) formed by the source or the gate region (22, 24), the gate electrode connecting trace (40) and the n-conducting region (16).

* * * * *